(12) United States Patent
Feng et al.

(10) Patent No.: US 12,212,299 B2
(45) Date of Patent: Jan. 28, 2025

(54) ELECTRONIC DEVICE AND FORMATION METHOD THEREFOR

(71) Applicant: SEMICONDUCTOR MANUFACTURING ELECTRONICS (SHAOXING) CORPORATION, Zhejiang (CN)

(72) Inventors: Xueli Feng, Zhejiang (CN); Shaohua Xiang, Zhejiang (CN); Chong Wang, Zhejiang (CN); Weizhong Shan, Zhejiang (CN)

(73) Assignee: SEMICONDUCTOR MANUFACTURING ELECTRONICS (SHAOXING) CORPORATION, Zhejiang (CN)

( * ) Notice: Subject to any disclaimer, the term of this patent is extended or adjusted under 35 U.S.C. 154(b) by 329 days.

(21) Appl. No.: 17/799,446

(22) PCT Filed: Jan. 19, 2022

(86) PCT No.: PCT/CN2022/072834
§ 371 (c)(1),
(2) Date: Aug. 12, 2022

(87) PCT Pub. No.: WO2022/156722
PCT Pub. Date: Jul. 28, 2022

(65) Prior Publication Data
US 2023/0344400 A1     Oct. 26, 2023

(30) Foreign Application Priority Data
Jan. 21, 2021   (CN) .......................... 202110078579.3

(51) Int. Cl.
*H03H 3/04*     (2006.01)
*H03H 9/10*     (2006.01)
*H03H 9/56*     (2006.01)

(52) U.S. Cl.
CPC ............ *H03H 3/04* (2013.01); *H03H 9/1042* (2013.01); *H03H 9/562* (2013.01); *H03H 9/564* (2013.01); *H03H 2003/045* (2013.01)

(58) Field of Classification Search
CPC ........ H03H 3/02; H03H 9/1014; H03H 9/105; H03H 9/0547; H03H 2003/021;
(Continued)

(56) References Cited

U.S. PATENT DOCUMENTS

2007/0138594 A1   6/2007  Lee et al.
2009/0289722 A1*  11/2009  Dropmann ................ H03F 1/56
                                                                                330/303
(Continued)

FOREIGN PATENT DOCUMENTS

CN       1977450 A      6/2007
CN       102111116 A    6/2011
(Continued)

*Primary Examiner* — Lincoln D Donovan
*Assistant Examiner* — Tyler J Pereny
(74) *Attorney, Agent, or Firm* — MUNCY, GEISSLER, OLDS & LOWE, P.C.

(57) ABSTRACT

An electronic device and a method of forming the same are disclosed. An emitter resonator and a reception cap cavity are formed on and in a first wafer, and an emitter cap cavity and a reception resonator are formed in and on a second wafer. After bonding together the first and second wafers, an emitter filter is formed in an emission region, and a reception filter is formed in a receiving region. The method provided in the present invention not only can simplify the fabrication process of the device and improve its accuracy and stability, but also facilitates integration of the emitter and receives filters in a same chip, which results in a higher degree of integration of the device and a more compact package size thereof.

10 Claims, 3 Drawing Sheets

(58) Field of Classification Search
CPC .. H03H 2003/023; H03H 9/173; H03H 9/564;
H03H 9/568; H03H 3/04; H03H 9/0523;
H03H 9/132; H03H 9/171; H03H 9/174;
H03H 3/08; H03H 9/0514; H03H 9/0542;
H03H 9/0571; H03H 9/1071; H03H
9/131; H03H 9/175; H03H 9/542; H03H
9/706; H01L 24/11; H01L 21/76802;
H01L 21/76877; H01L 21/78; H01L
2224/0391; H01L 2224/11; H01L
2224/73265; H01L 24/03; H01L 24/94;
H01L 24/83; H01L 24/29; H01L 24/27;
H01L 24/16; Y10T 29/42
See application file for complete search history.

(56) References Cited

U.S. PATENT DOCUMENTS

| | | |
|---|---|---|
| 2012/0049978 A1 | 3/2012 | Pang et al. |
| 2014/0111062 A1 | 4/2014 | Bauer et al. |
| 2020/0259478 A1 | 8/2020 | Dogiamis et al. |

FOREIGN PATENT DOCUMENTS

| | | | | |
|---|---|---|---|---|
| CN | 1977450 B | | 12/2011 | |
| CN | 110635778 A | | 12/2019 | |
| CN | 110911785 A | * | 3/2020 | ............... H01P 1/20 |
| CN | 111162755 A | | 5/2020 | |
| CN | 112018229 A | | 12/2020 | |
| CN | 112422101 A | | 2/2021 | |
| JP | 2007235304 A | | 9/2007 | |
| JP | 2008172713 A | | 7/2008 | |
| WO | WO2008023478 A1 | | 2/2008 | |

* cited by examiner

ELECTRONIC DEVICE AND FORMATION METHOD THEREFOR

TECHNICAL FIELD

The present invention relates to the field of semiconductor technology and, in particular, to an electronic device and a method of forming the same.

BACKGROUND

The fabrication of an electronic device containing filters of different frequencies usually involves separately forming the filters and then integrating them with the remaining part of the electronic device. For example, multi-frequency duplexers can isolate an emission signal from a receiving signal, ensuring that reception and emitter can be separately accomplished without mutual interference. Therefore, they are widely used in the field of mobile communication. Specifically, a duplexer is typically composed of two filters of different frequencies (respectively an emitter filter and a reception filter). Bulk acoustic wave (BAW) filters are extensively used for this purpose thanks to a wide range of advantages including a high operating frequency, a compact size, low insertion loss, a high Q value and compatibility with semiconductor processes.

An operating frequency of a BAW filter is typically determined by thicknesses of thin films in its resonator. Therefore, the emitter filter and reception filter of different frequencies incorporated in an electronic device differ in terms of their thin film parameters. Consequently, forming the emitter filter and reception filter on the same wafer is challenging because frequency adjustment of one filter is affected by that of the other and cannot be accomplished accurately.

SUMMARY

It is an object of the present invention to provide a method of forming an electronic device, which enables separate accurate frequency adjustment of transmit and reception filter of different frequencies in the electronic device, thus helping to achieve a desired overall size of the electronic device.

To this end, the present invention provides a method of forming an electronic device, including: providing a first wafer and a second wafer, forming a reception cap cavity in a receiving region of the first wafer by etching the first wafer, forming an emitter resonator in an emission region of the first wafer by sequentially forming therein a bottom electrode, a piezoelectric layer, a top electrode and a passivation layer, forming an emitter cap cavity in an emission region of the second wafer by etching the second wafer, and forming a reception resonator in a receiving region of the second wafer by sequentially forming therein a bottom electrode, a piezoelectric layer, a top electrode and a passivation layer; and bonding together the first and second wafers so that the reception cap cavity in the first wafer sealingly closes the reception resonator on the second wafer to result in the formation of a reception filter and that the emitter cap cavity in the second wafer sealingly closes the emitter resonator on the first wafer to result in the formation of an emitter filter.

Optionally, a hollow cavity may be further formed in the emission region of the first wafer, with the emitter filter including the hollow cavity, the emitter resonator and the emitter cap cavity, which are arranged in a direction pointing from the first wafer to the second wafer. Additionally, a hollow cavity may be further formed in the receiving region of the second wafer, with the reception filter including the hollow cavity, the reception resonator and the reception cap cavity, which are arranged in a direction pointing from the second wafer to the first wafer, and thus being inverted relative to the emitter filter.

Optionally, as a result of the first and second wafers being bonded together, an order of arrangement of the layers in the reception resonator may be reversed to an order of arrangement of the layers in the emitter resonator.

Optionally, a hollow cavity may be further formed in the emission region of the first wafer so that the emitter resonator is situated above the hollow cavity, and the hollow cavity and the reception cap cavity in the first wafer may be simultaneously formed in a same process using a same photomask. Additionally or alternatively, a hollow cavity may be further formed in the receiving region of the second wafer so that the reception resonator is situated above the hollow cavity, and the hollow cavity and the emitter cap cavity in the second wafer may be simultaneously formed in a same process using a same photomask.

Optionally, the formation of the emitter resonator may further include laterally etching an end portion of the top electrode in the emission region with a first etching parameter, so that a corresponding end portion of the passivation layer forms a suspended portion, wherein the formation of the reception resonator further includes laterally etching an end portion of the top electrode in the receiving region with a second etching parameter, so that a corresponding end portion of the passivation layer forms a suspended portion, the second etching parameter differing from the first etching parameter.

Optionally, emitter connectors may be further formed in the emission region of the first wafer beside the emitter resonator and electrically connected thereto, and emitter bond posts may be further formed in the emission region of the second wafer in alignment with the respective transmit connector and joined thereto as a result of the bonding of the first and second wafers, resulting the formation of emitter pick-ups. Additionally or alternatively, receive connectors may be further formed in the receiving region of the second wafer beside the reception resonator and electrically connected thereto, and reception bond posts may be further formed in the receiving region of the first wafer in alignment with the respective receive connectors and joined thereto as a result of the bonding of the first and second wafers, resulting the formation of reception pick-ups.

Optionally, subsequent to the bonding of the first and second wafers, the method of further include: thinning the first or second wafer and forming, in the thinned wafer by etching it, a plurality of contact holes in which the emitter and reception pick-ups are exposed; forming conductive plugs in the contact holes and contact pads on the thinned wafer, which cover and are electrically connected to the conductive plugs; and forming solder balls on the contact pads.

Optionally, a first bond ring surrounding both the emission and receiving regions may be further formed on the first wafer, with a second bond ring being further formed on the second wafer in alignment with the first bond ring, wherein the first bond ring is joined to the second bond ring as a result of the bonding of the first and second wafers.

It is another object of the present invention to provide an electronic device including a first wafer and a second wafer, which are bonded together, wherein in an emission region, an emitter resonator is formed on the first wafer, the emitter resonator including a first electrode, a piezoelectric layer, a top electrode and a passivation layer, which are sequentially stacked in a direction pointing from the first wafer to the second wafer, and an emitter cap cavity is formed in the second wafer, the emitter cap cavity sealingly closing the emitter resonator so that they together form an emitter filter, and wherein in a receiving region, a reception cap cavity is formed in the first wafer, and a reception resonator is formed on the second wafer, the reception resonator including a bottom electrode, a piezoelectric layer, a top electrode and a passivation layer, which are sequentially stacked in a direction pointing from the second wafer to the first wafer, the reception cap cavity sealingly closing the reception resonator so that they together form a reception filter.

Optionally, the emitter resonator in the emission region may be adapted to form part of the emitter filter, with the reception resonator in the receiving region being adapted to form part of the reception filter that is inverted relative to the emitter filter.

Optionally, a sealing ring may be further formed between the first and second wafers, the sealing ring surrounding both the emitter and reception filters.

In the electronic device and method of the present invention, the emitter resonator and the reception cap cavity are formed on and in the first wafer, and the emitter cap cavity and the reception resonator are formed in and on the second wafer. In this way, as a result of bonding together the first and second wafers, the emitter filter is formed in the emission region, and the reception filter is formed in the receiving region. Therefore, the method of the present invention not only can simplify the fabrication process of the device, but also facilitates integration of the emitter and reception filters in a same chip, which results in a higher degree of integration, a more compact package size and lower packaging cost, of the device. Moreover, according to the present invention, although the emitter and reception filters are integrated in the same chip, separate accurate frequency adjustment of the emitter and reception filters is still possible, making the device more accurate and more stable.

In these figures, 100T—emission region; 100R—receiving region; 110—first wafer; 120—second wafer; 200T—emitter resonator; 200R—reception resonator; 210T/210R—bottom electrode; 220T/220R—piezoelectric layer; 230T/230R—top electrode; 240T/240R—passivation layer; 250T/250R—hollow cavity; 300T—emitter cap cavity; 300R—reception cap cavity; 410T—first emitter pick-up; 410R—first reception pick-up; 420T—second emitter pick-up; 420R—second reception pick-up; 500—sacrificial layer; 610T/610R—first connector; 620T/620R—second connector; 710—first bond ring; 720—second bond ring; 700—sealing ring; 810R—reception bond post; 820T—emitter bond post; 910—contact hole; 920—conductive plug; 930—contact pad; 940—solder ball.

DETAILED DESCRIPTION

As discussed in the Background section, for an electronic device incorporating an emitter filter and a reception filter, it is necessary to separately set thin film parameters of these filters in order to enable them to operate at their respective desired frequencies. However, forming resonators of the emitter and reception filters on the same wafer is challenging because setting of thin film parameters of each filter will be affected by that of the other and thus cannot be accomplished in an accurate way. For example, top electrodes of the emitter and reception filters may have different thicknesses. In this case, when laterally etching back the top electrodes to form cavities, over which end portions of a passivation layer overlying the top electrodes are suspended, it is difficult to control the volumes of the top electrodes removed during the etching process due to their different thicknesses, while inaccurate control may affect a Q value of the resulting device.

In order to overcome this, the emitter and reception filters may be formed on two separate wafers, and after the resonators of the emitter and reception filters are successively formed on the two wafers, two additional wafers may be provided to sealingly close the respective resonators of the emitter and reception filters, thereby packaging the emitter and reception filters. In this way, although separate frequency adjustment of the emitter and reception filters is possible, the use of at least four wafers is required to package the emitter and reception filters in separate chips. This makes the fabrication of the device more tedious and costly and reduces its degree of integration.

Figure 1:
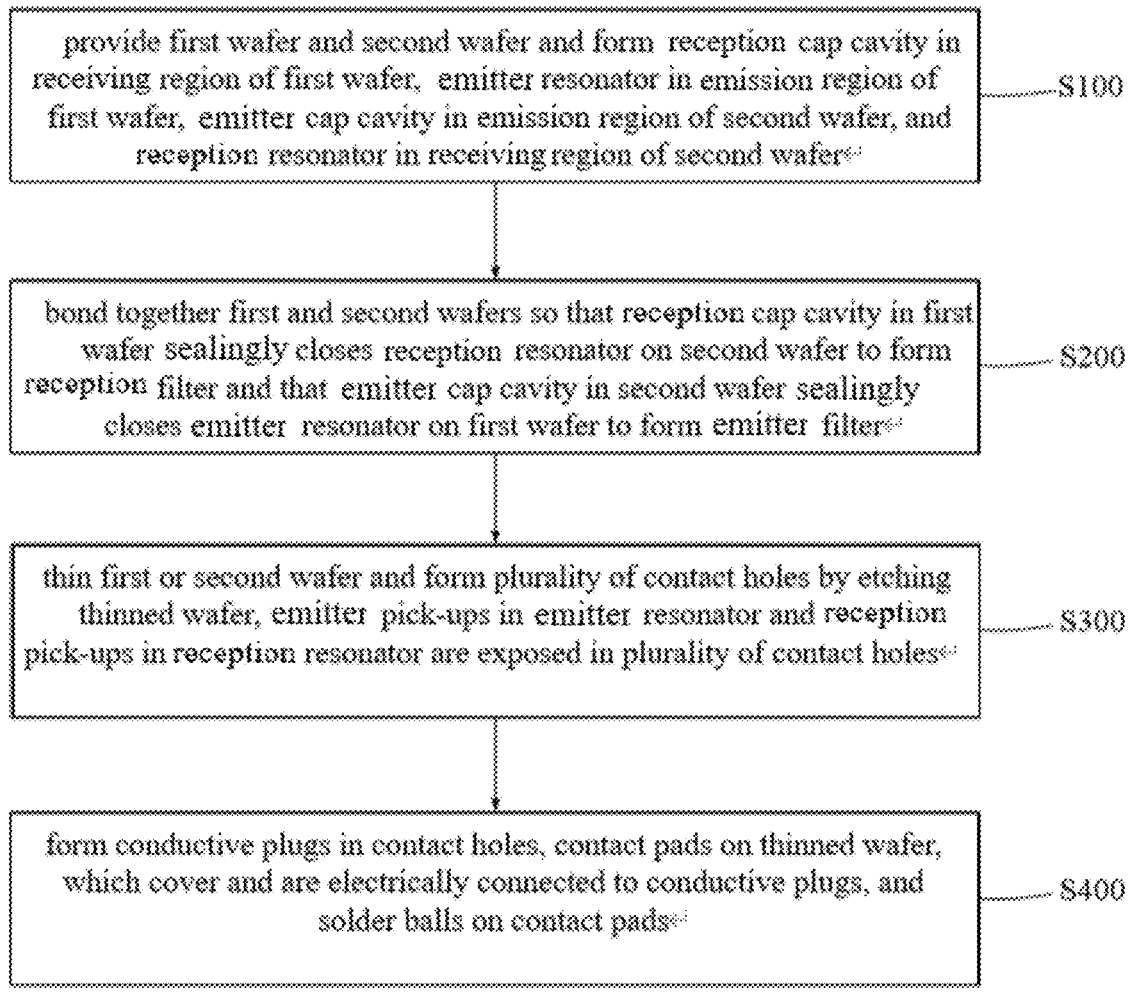
FIG. 1 is a schematic flow diagram showing a method of forming an electronic device according to an embodiment of the present invention.

In view of this, the present invention provides a method of forming an electronic device, which allows not only accurate frequency adjustment of both the emitter and reception filters but also a higher degree of integration and lower fabrication cost of the device. In particular, reference may be made to FIG. 1. The method includes: in step S100, providing a first wafer and a second wafer, the first wafer having an emission region in which an emitter resonator is formed, the first wafer having a receiving region in which a reception cap cavity is formed, the second wafer having an emission region in which an emitter cap cavity is formed, the second wafer having a receiving region in which a reception resonator is formed; and in step S200, bonding together the first and second wafers so that the reception cap cavity in the first wafer covers the reception resonator on the second wafer to form a reception filter and that the emitter cap cavity in the second wafer covers the emitter resonator on the first wafer to form an emitter filter.

The electronic device and method proposed in the present invention will be described in greater detail below with reference to FIGS. 2 to 8 and particular embodiments. FIGS. 2 to 8 are schematic diagrams showing intermediate structures formed in a method of forming an electronic device according to an embodiment of the present invention. Advantages and features of the present invention will become more apparent from the following description. Note that the figures are provided in a very simplified form not necessarily drawn to exact scale and for the only purpose of helping to explain the disclosed embodiments in a more convenient and clearer way. The relative terms "above", "under", "top", "bottom", "front", "rear" and the like can be used herein in connection with the orientation depicted in the accompanying drawings to describe relationships between different components. These relative terms are intended to encompass different orientations in addition to the orientation depicted in the figures. For example, if the device in the figures is inverted, an element described as "above" another element would then be oriented "under" the other element.

At first, step S100 is performed. Specifically, referring to FIGS. 2 to 5, a first wafer 110 and a second wafer 120 are provided.

Figure 2:
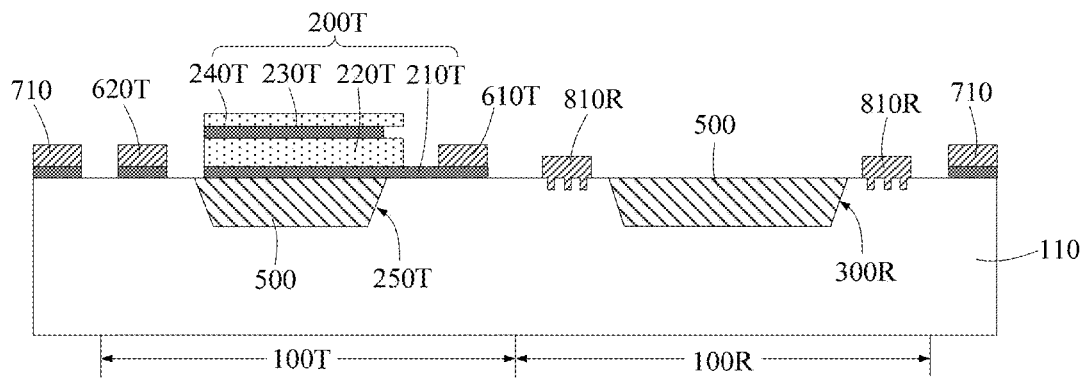
FIGS. 2 to 8 are schematic diagrams showing intermediate structures formed in a method of forming an electronic device according to an embodiment of the present invention.

With particular reference to FIG. 2, an emitter resonator 200T is formed in an emission region 100T of the first wafer 110. Specifically, the emitter resonator 200T may form part of an emitter filter (e.g., a transmit BAW filter). Moreover, A hollow cavity 250T is also formed in the emission region 100T of the first wafer 110 and the emitter resonator 200T is located above the hollow cavity 250T. A reception cap cavity 300R is formed in a receiving region 100R of the first wafer 110.

In this embodiment, the hollow cavity 250T and the reception cap cavity 300R in the emission region 100T may be formed in a same process. Specifically, the hollow cavity 250T and the reception cap cavity 300R may be simultaneously formed in the first wafer 110 by a photolithography process using the same photomask. After being formed, the hollow cavity 250T and the reception cap cavity 300R are filled with a sacrificial layer 500. Specifically, a planarization process may be employed to make the sacrificial layer 500 flush with the hollow cavity 250T and the reception cap cavity 300R. This facilitates the subsequent formation of the resonators.

With continued reference to FIG. 2, the emitter resonator 200T is formed on the first wafer 110, the emitter resonator 200T includes a bottom electrode 210T, a piezoelectric layer 220T, a top electrode 230T and a passivation layer 240T, which are sequentially stacked over the first wafer 110. Materials of the bottom electrode 210T and the top electrode 230T both include, for example, molybdenum (Mo). Materials of the piezoelectric layer 220T and the passivation layer 240T may include, for example, at least one of zinc oxide (ZnO), aluminum nitride (AlN) and lead zirconium titanate (PZT).

In this embodiment, a method for forming the emitter resonator 200T includes laterally etching an end portion of the top electrode 230T with a first etching parameter, so that a corresponding end portion of the passivation layer 240T forms a suspended portion, which helps increase a quality factor (Q value) of the filter. It is to be noted that since only the resonator of the emitter filter is formed on the first wafer 110, it is possible to accurately control a volume of the top electrode 230T etched away during the etch-back process and thus ensure performance of the resulting filter, simply by laterally etching it with a parameter depending on a thickness of the top electrode 230T in the resonator of the emitter filter.

After the emitter resonator 200T is formed, the method further includes forming emitter connectors in the emission region 100T of the first wafer 110. The emitter connectors are located beside the emitter resonator 200T and is electrically connected to the emitter resonator 200T. The emitter connectors include a first connector 610T and a second connector 620T. The first connector 610T is electrically connected to the bottom electrode 210T, and the second connector 620T is electrically connected to the top electrode 230T. In this embodiment, the bottom electrode 210T has an end portion extending beyond the overlying layers, and the first connector 610T is formed on this end portion of the bottom electrode 210T. Further, although the electrical connection of the second connector 620T to the top electrode 230T is not explicitly shown in the schematic cross-sectional view of FIG. 2, those skilled in the art would know that the second connector 620T may be electrically connected to the top electrode 230T by means of another interconnection feature.

In this embodiment, concurrently with the formation of the bottom electrode 210T of the emitter resonator 200T, a top electrode pick-up separate from the bottom electrode 210T is also formed in the emission region 100T of the first wafer, and the second connector 620T is formed on the top electrode pick-up. That is, in this embodiment, the first connector 610T and the second connector 620T are formed on the bottom electrode 210T and top electrode pick-up, respectively, which are mutually separated portions of the same conductive material layer. As such, the first connector 610T and the second connector 620T have the equal or essentially equal heights. This facilitates electrical connection of both the first connector 610T and the second connector 620T during the subsequent packaging process.

In addition, the first connector 610T and the second connector 620T connected to the emitter resonator 200T are located on opposite sides of the emitter resonator 200T and are both formed of metallic materials. For example, both may be formed of at least one of aluminum (Al), gold (Au), copper (Cu) and molybdenum (Mo). On the one hand, this can ensure electrical conductivity of the first connector 610T and the second connector 620T. On the other hand, during the subsequent bonding process, the first connector 610T and the second connector 620T may additionally function to aid the bonding and provide support on the opposite sides of the emitter resonator 200T, preventing the material defining the emitter cap cavity that is subsequently disposed over the emitter resonator 200T so as to sealingly close it from collapsing downward and coming into contact with the resonator.

Further, reception bond posts 810R are formed in the receiving region 100R of the first wafer 110. The reception bond posts 810R are arranged beside the reception cap cavity 300R and are aligned with respective reception connectors on the second wafer 120. In this embodiment, at least two reception bond posts 810R are disposed on opposite sides of the reception cap cavity 300R and are aligned respectively with a first connector 610R and a second connector 620R on the second wafer 120 adapted for connecting the reception resonator 200R. In the subsequent bonding process, the at least two reception bond posts 810R are adapted to be bonded respectively to the first connector 610R and the second connector 620R on the opposite sides of the reception resonator 200R.

Further, bottom portions of the reception bond posts 810R are embedded in the first wafer 110. Specifically, before each reception bond post 810R is formed, at least one groove may be formed in a surface of the first wafer 110, creating a non-flat surface portion. Subsequently, the reception bond post 810R may be so formed as to fill the groove and thus be partially embedded in the first wafer 110. This helps increasing adhesion strength of the reception bond posts 810R to the first wafer 110.

With continued reference to FIG. 2, a first bond ring 710 surrounding both the emission region 100T and the receiving region 100T is further formed on the first wafer 110. It can be considered that one such bond ring 710 delimits one electronic device and corresponds to one semiconductor chip. That is, in this embodiment, the emitter and reception filters in the electronic device are both integrated in a same semiconductor chip.

In this embodiment, the first bond ring 710, the reception bond posts 810R and the first connector 610T and the second connector 620T connected to the emitter resonator 200T may be formed of the same material in a same process.

Figure 3:
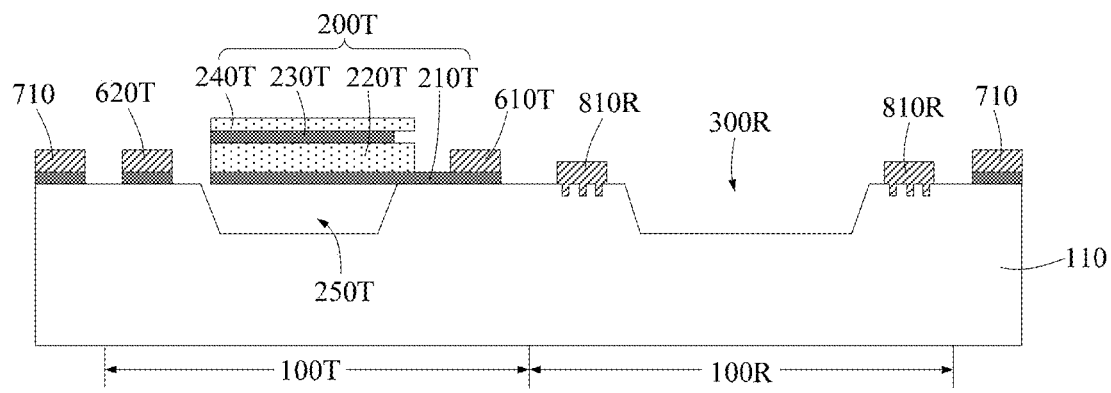

Subsequently, with particular reference to FIG. 3, after the emitter resonator 200T and other components (e.g., the connectors, bond posts, etc.) are formed, the sacrificial layer in the hollow cavity 250T and the reception cap cavity 300R may be removed to release the hollow cavity 250T and the reception cap cavity 300R.

Figure 4:
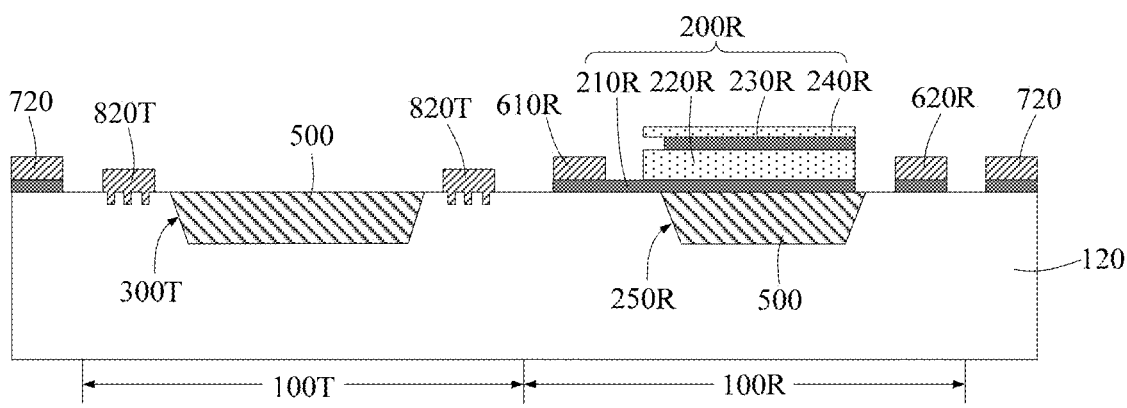

After that, with particular reference to FIG. 4, an emitter cap cavity 300T is formed in an emission region 100T of the second wafer 120, and a reception resonator 200R is formed in a receiving region 100R of the second wafer 120. Specifically, the reception resonator 200R may form part of a reception filter (e.g., a reception BAW filter). Moreover, a hollow cavity 250R is formed in the receiving region 100R of the second wafer 120 and the reception resonator 200R is located above the hollow cavity 250R.

Similar to the first wafer 110, the hollow cavity 250R and the emitter cap cavity 300T in the receiving region 100R of the second wafer 120 may be formed in a same process. Specifically, the hollow cavity 250R and the emitter cap cavity 300T may be simultaneously formed in the second wafer 120 by a photolithography process using the same photomask. After being formed, the hollow cavity 250R and the emitter cap cavity 300T are filled with a sacrificial layer 500.

With continued reference to FIG. 4, the reception resonator 200R on the second wafer 120 includes a bottom electrode 210R, a piezoelectric layer 220R, a top electrode 230R and a passivation layer 240R, which are sequentially stacked over the second wafer 120. Materials of the bottom electrode 210R and the top electrode 230R both include, for example, molybdenum (Mo). Materials of the piezoelectric layer 220R and the passivation layer 240R may include, for example, at least one of zinc oxide (ZnO), aluminum nitride (AlN) and lead zirconium titanate (PZT).

It is to be noted that the emitter filter formed in the emission region 100T and the reception filter formed in the receiving region 100R are usually of different frequencies. Therefore, the layers in the emitter resonator 200T may have different thicknesses from the layers in the reception resonator 200R. For example, the thickness of the top electrode 230T in the emitter resonator 200T may differ from the thickness of the top electrode 230R in the reception resonator 200R; and/or the thickness of the passivation layer 240T in the emitter resonator 200T may differ from the thickness of the passivation layer 240R in the reception resonator 200R; and so forth. In particular, the layers in the emitter resonator 200T may be thicker than those in the reception resonator 200R.

A method for forming the reception resonator 200R includes laterally etching an end portion of the top electrode 230R with a second etching parameter, so that a corresponding end portion of the passivation layer 240R forms a suspended portion, which helps increase a quality factor (Q value) of the filter. It is to be noted that since only the resonator of the reception filter is formed on the second wafer 120, it is possible to accurately control a volume of the top electrode 230R etched away during the etch-back process and thus ensure performance of the resulting filter, simply by laterally etching it with a parameter depending on the thickness of the top electrode 230R in the resonator of the emitter filter.

In this embodiment, the thickness of the top electrode 230T in the emitter resonator 200T is different from the thickness of the top electrode 230R in the reception resonator 200R. Accordingly, the second etching parameter is different from the first etching parameter. For example, the second etching parameter may include an etching time differing from an etching time in the first etching parameter; and/or the second etching parameter may include an etchant concentration differing from an etchant concentration in the first etching parameter; and so forth. As a particular example, in case of the thickness of the top electrode 230T in the emitter resonator 200T being greater than the thickness of the top electrode 230R in the reception resonator 200R, the etching time in the first etching parameter may be longer than the etching time in the second etching parameter.

In correspondence with the first wafer 110, reception connectors are further formed in the receiving region 100R of the second wafer 120. The reception connectors are situated beside the reception resonators 200R and electrically connected to the reception resonators 200R. Specifically, the reception connectors include a first connector 610R and a second connector 620R. The first connector 610R is electrically connected to the bottom electrode 210R, and the second connector 620R is electrically connected to the top electrode 230R. Further, the first connector 610R and the second connector 620R both connected to the reception resonator 200R are disposed on opposite sides of the reception resonator 200R.

Reference can be made to the above description in connection with the connection between the emitter resonator 200T and the first connector 610T and the second connector 620T for details in the connection of the reception resonator 200R with the first connector 610R and the second connector 620R. Materials of the layers in the reception resonator 200R may be the same as those of the layers in the emitter resonator 200T, and a further description thereof is omitted here.

With continued reference to FIG. 4, emitter bond posts 820T are further formed in the emission region 100T of the second wafer 120. The emitter bond posts 820T are arranged beside the emitter cap cavity 300T and aligned with the respective emitter connectors on the first wafer 110. In this embodiment, at least two emitter bond posts 820T are disposed on opposite sides of the emitter cap cavity 300T and aligned respectively with the first connector 610T and the second connector 620T on the first wafer 110 adapted for connection of the emitter resonator 200T. In the subsequent bonding process, the at least two emitter bond posts 820T are adapted to be bonded respectively to the first connector 610T and the second connector 620T on the opposite sides of the emitter resonator 200T.

Similarly, bottom portions of the emitter bond posts 820T are embedded in the second wafer 120 in order to achieve improved adhesion strength of the emitter bond posts 820T to the second wafer 120. Reference can be made to the above description in connection with the structures of the reception bond posts 810R on the first wafer 110 for details in this, and a further description thereof is omitted here.

With continued reference to FIG. 4, a second bond ring 720 is formed on the second wafer 120 in alignment with the first bond ring 710 on the first wafer 110. In the bonding process, the first bond ring 710 is bonded to the second bond ring 720. As a result, the second bond ring 720 surrounds both the emission region 100T and the receiving region 100R.

Figure 5:
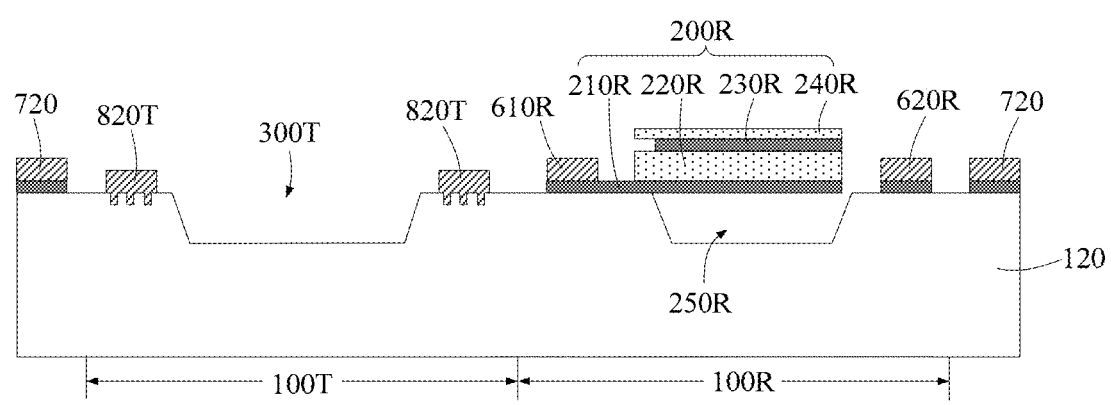

Next, with particular reference to FIG. 5, after the reception resonator 200R and other components (e.g., the connectors, bond posts, etc.) are formed, the sacrificial layer in the hollow cavity 250R and the emitter cap cavity 300T may be removed to release the hollow cavity 250R and the emitter cap cavity 300T.

Figure 6:
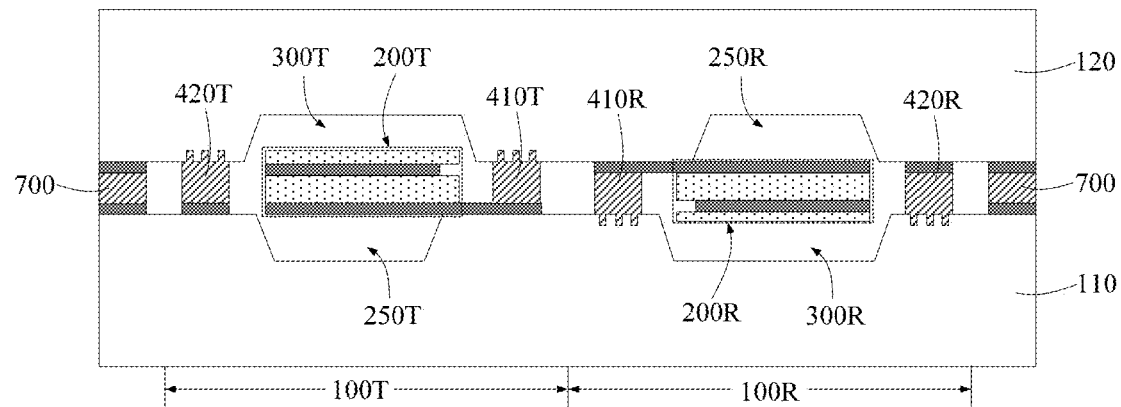

After that, step S200 is performed. With particular reference to FIG. 6, the first wafer 110 and the second wafer 120 are bonded together so that the reception cap cavity 300R in the first wafer 110 covers the reception resonator 200R on the second wafer 120 to form the reception filter and that the emitter cap cavity 300T in the second wafer 120 covers the emitter resonator 200T on the first wafer 110 to form the emitter filter.

In this embodiment, the emitter filter includes the hollow cavity 250T, the emitter resonator 200T and the emitter cap cavity 300T, which are arranged sequentially in a direction pointing from the first wafer 110 to the second wafer 120. Moreover, the reception filter includes the hollow cavity 250R, the reception resonator 200R and the reception cap cavity 300R, which are arranged sequentially in a direction pointing from the second wafer 120 to the first wafer 110. That is, the reception filter is inverted relative to the emitter filter.

With continued reference to FIG. 6, the first wafer 110 and the second wafer 120 are bonded together in such a manner that the order of arrangement of the layers in the reception resonator 200R in the receiving region 100R is reversed to that of the layers in the emitter resonator 200T in the emission region 100T. For example, in this embodiment, the bottom electrode, the piezoelectric layer, the top electrode and the passivation layer in the emitter resonator 200T are sequentially stacked from the bottom upward, while the bottom electrode, the piezoelectric layer, the top electrode and the passivation layer in the reception resonator 200R are sequentially stacked from the top downward.

Additionally, the first wafer 110 and the second wafer 120 are bonded together so that the first bond ring on the first wafer 110 is joined to the second bond ring on the second wafer 120 to form a sealing ring 700. In this way, the emitter and reception filters are enclosed within the same semiconductor chip.

Further, the first wafer 110 and the second wafer 120 are bonded together so that the reception bond posts on the first wafer 110 are joined to the respective receive connectors on the second wafer 120 to form reception pick-ups, and the emitter bond posts on the second wafer 120 are joined to the respective emitter connectors on the first wafer 110 to form emitter pick-ups. Specifically, in the emission region 100T, the first and second connectors on the first wafer 110 are joined to the respective emitter bond posts on the second wafer 120 to form a first emitter pick-up 410T and a second emitter pick-up 420T. Additionally, in the receiving region 100R, the first and second connectors on the second wafer 120 are joined to the respective reception bond posts on the first wafer 110 to form a first reception pick-up 410R and a second reception pick-up 420R.

In this embodiment, the bonding of the first wafer 110 and the second wafer 120 is accomplished by metallically bonding the first bond ring to the second bond ring to form the sealing ring 700. Additionally, in the emission region 100T, the connectors may be metallically bonded to the respective bond posts on the opposite sides of the emitter resonator 200T. This not only allows increased bonding strength between the first wafer 110 and the second wafer 120, but also enables the emitter pick-ups resulting from the bonding to provide support on the opposite sides of the emitter resonator 200T to enhance mechanical strength of the device. Similarly, in the receiving region 100R, the connectors may also be metallically bonded to the respective bond posts on the opposite sides of the reception resonator 200R, further increasing the bonding strength between the wafers. Moreover, the resulting reception pick-ups also provide support on the opposite sides of the reception resonator 200R.

Figure 7:
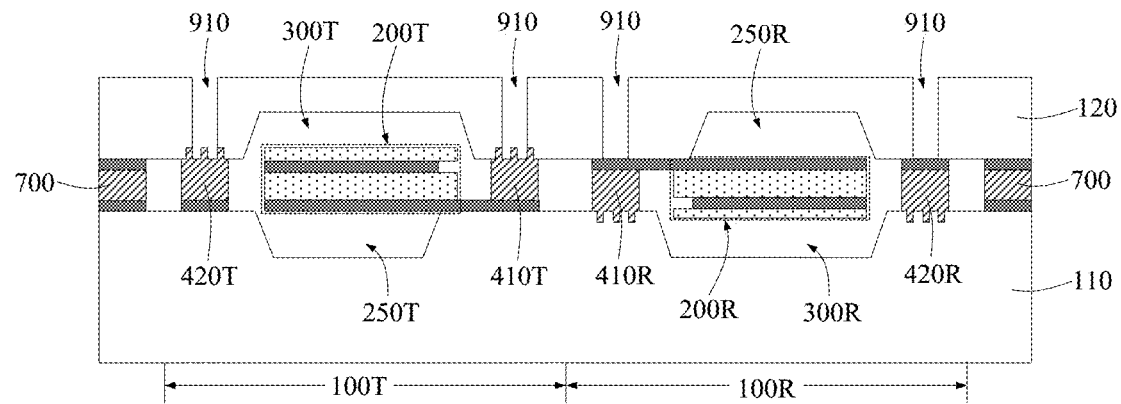

Additionally, the method further include, in step S300, with particular reference to FIG. 7, thinning the first wafer 110 or the second wafer 120 and etching the thinned wafer to form therein multiple contact holes 910, in which the emitter pick-ups in the emitter resonator 200T (including the first emitter pick-up 410T and the second emitter pick-up 420T) and the reception pick-ups in the reception resonator 200R (including the first reception pick-up 410R and the second reception pick-up 420R) are respectively exposed.

In this embodiment, the second wafer 120 is thinned and etched, resulting in the formation of the contact holes 910 in the second wafer 120. However, in other embodiments, the first wafer 110 may be thinned and etched, resulting in the formation of the contact holes in the first wafer 110.

Figure 8:
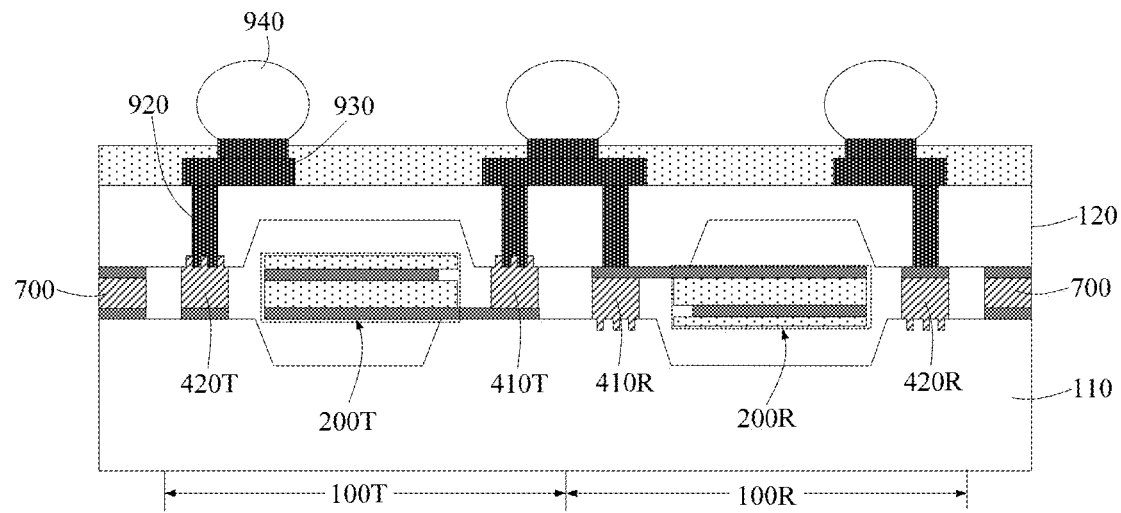

Next, in step S400, with particular reference to FIG. 8, conductive plugs 920 are formed in the contact holes 910, contact pads 930 are formed on the processed wafer so as to cover and be electrically connected to the respective conductive plugs 920, and solder balls 940 are formed on the respective contact pads 930.

One of the pick-ups in the emitter resonator 200T (the first emitter pick-up 410T in this embodiment) and one of the pick-ups in the reception resonator 200R (the first reception pick-up 410R in this embodiment) are both electrically connected to a same one of the solder balls 940, and this solder ball 940 (i.e., the solder ball connected to both the emitter and reception pick-ups) corresponds to an antenna port.

Additionally, the method further includes forming a semiconductor chip of the electronic device by dicing the structure resulting from the bonding along the sealing ring 700. According to this embodiment, the emitter and reception filters in the electronic device are integrated in the same semiconductor chip.

On the basis of the method as described above, in embodiments of the present invention, there is also provided an electronic device. Specifically, referring to FIGS. 7 and 8, the electronic device includes a first wafer 110 and a second wafer 120, which are bonded together.

An emitter resonator 200T is formed in an emission region 100T of the first wafer 110, and an emitter cap cavity 300T is formed in the second wafer 120. The emitter cap cavity 300T sealingly closes the emitter resonator 200T. In this way, for example, an emitter filter can be formed in the emission region 100T.

In addition, a reception cap cavity 300R is formed in a receiving region 100R of the first wafer 110, and a reception resonator 200R is formed on the second wafer 120. The reception cap cavity 300R sealingly closes the reception resonator 200R. In this way, for example, a reception filter can be formed in the receiving region 100R.

With continued reference to FIGS. 7 and 8, the reception filter is inverted relative to the emitter filter. Specifically, the reception filter includes a hollow cavity, the resonator and the cap cavity, which are sequentially arranged in the direction pointing from the second wafer 120 to the first wafer 110, while the emitter filter includes a hollow cavity the resonator and the cap cavity, which are sequentially arranged in the direction pointing from first wafer 110 to the second wafer 120. More specifically, the reception resonator 200R in the reception filter is inverted relative to the emitter resonator 200T in the emitter filter.

In this embodiment, the emitter and reception filters are integrated in the same semiconductor chip in a creative manner by inverting them relative to each other. This helps simplify the fabrication process and reduce process cost, and enables an effective improved degree of integration, a more compact package size and reduced packaging cost. Moreover, although the emitter and reception filters are integrated in the same semiconductor chip, separate accurate frequency adjustment of the filters of different frequencies is still possible without mutual interference between the processes for forming the emitter and reception resonators, making the fabrication process more flexible and more accurate.

It is to be noted that while the present invention has been described with reference to several preferred embodiments, the forgoing embodiments are not intended to limit the invention. In light of the teachings hereinabove, any person familiar with the art may make various possible variations and changes to the disclosed embodiments or modify them into equivalent alternatives, without departing from the scope thereof. Accordingly, any and all such simple variations, equivalent alternatives and modifications made to the foregoing embodiments without departing from the scope of the invention are intended to fall within the scope thereof.

It is to be understood that, as used herein, the terms "first", "second", "third" and the like are only meant to distinguish various components, elements, steps, etc. from each other rather than indicate logical or sequential orderings thereof, unless otherwise indicated or specified.

Further, it is also to be recognized that the terminology used herein is for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and sub-means. All conjunctions used are to be understood in the most inclusive sense possible. Thus, the term "or" should be understood as having the definition of a logical "or" rather than that of a logical "exclusive or" unless the context clearly necessitates otherwise. Further, implementation of the method and/or device according to the embodiments of the present invention may involve performing selected tasks manually, automatically, or a combination thereof.

What is claimed is:

1. A method of forming an electronic device, comprising:
providing a first wafer and a second wafer, forming a reception cap cavity in a receiving region of the first wafer by etching the first wafer, forming an emitter resonator in an emission region of the first wafer by sequentially forming therein a first electrode, a piezoelectric layer, a second electrode and a passivation layer, forming an emitter cap cavity in an emission region of the second wafer by etching the second wafer, and forming a reception resonator in a receiving region of the second wafer by sequentially forming therein a first electrode, a piezoelectric layer, a second electrode and a passivation layer; and
bonding together the first and second wafers so that the reception cap cavity in the first wafer sealingly closes the reception resonator on the second wafer to form a reception filter and that the emitter cap cavity in the second wafer sealingly closes the emitter resonator on the first wafer to form an emitter filter,
wherein a first hollow cavity is further formed in the emission region of the first wafer, and the emitter filter comprising the first hollow cavity, the emitter resonator and the emitter cap cavity, which are arranged in a direction pointing from the first wafer to the second wafer, and
wherein a second hollow cavity is further formed in the receiving region of the second wafer, the reception filter comprising the second hollow cavity, the reception resonator and the reception cap cavity, which are arranged in a direction pointing from the second wafer to the first wafer, and wherein the reception filter is inverted relative to the emitter filter.

2. The method of forming an electronic device of claim 1, wherein after bonding together the first and second wafers, an order of arrangement of the layers in the reception resonator is reversed to an order of arrangement of the layers in the emitter resonator.

3. The method of forming an electronic device of claim 1, wherein the emitter resonator is formed above the first hollow cavity, and the first hollow cavity and the reception cap cavity in the first wafer are simultaneously formed in a same process using a same photomask; and/or
wherein the reception resonator is formed above the second hollow cavity, and the second hollow cavity and the emitter cap cavity in the second wafer are simultaneously formed in a same process using a same photomask.

4. The method of forming an electronic device of claim 1, wherein the formation of the emitter resonator further comprises laterally etching an end portion of the second electrode in the emission region with a first etching parameter, so that a corresponding end portion of the passivation layer forms a suspended portion, and
wherein the formation of the reception resonator further comprises laterally etching an end portion of the second electrode in the receiving region with a second etching parameter, so that a corresponding end portion of the passivation layer forms a suspended portion, wherein the second etching parameter differs from the first etching parameter.

5. The method of forming an electronic device of claim 1, wherein emitter connectors are further formed in the emission region of the first wafer beside the emitter resonator and are electrically connected to the emitter resonator, and emitter bond posts are further formed in the emission region of the second wafer in alignment with the respective emitter connectors, and when bonding together the first and second wafers, the emitter bond posts and the respective emitter connectors are bonded and connected to form emitter pick-ups, and/or
wherein receive connectors are further formed in the receiving region of the second wafer beside the reception resonator and are electrically connected to the reception resonator, and reception bond posts are further formed in the receiving region of the first wafer in alignment with the respective receive connectors, and when bonding together the first and second wafers, the reception bond posts and the respective receive connectors are bonded and connected to form reception pick-ups.

6. The method of forming an electronic device of claim 5, further comprising, subsequent to the bonding of the first and second wafers:
thinning the first or second wafer, and etching the thinned wafer to form a plurality of contact holes, the emitter pick-ups and the reception pick-ups are exposed in the plurality of contact holes;
forming conductive plugs in the contact holes and contact pads on the thinned wafer, the contact pads covering the conductive plugs so as to be electrically connected to the conductive plugs; and
forming solder balls on the contact pads.

7. The method of forming an electronic device of claim 1, wherein a first bond ring is further formed on the first wafer, the first bond ring surrounding both the emission and receiving regions, and wherein a second bond ring is further formed on the second wafer, the second bond ring is alignment with the first bond ring, and wherein the first bond ring and the second bond ring are bonded and connected as a result of the bonding of the first and second wafers.

8. An electronic device, comprising a first wafer and a second wafer, which are bonded together, wherein in an emission region, an emitter resonator is formed on the first wafer, the emitter resonator comprising a first electrode, a piezoelectric layer, a second electrode and a passivation layer, which are sequentially stacked in a direction pointing from the first wafer to the second wafer, and an emitter cap cavity is formed in the second wafer, the emitter cap cavity sealingly closing the emitter resonator to form an emitter filter, wherein in a receiving region, a reception cap cavity is formed in the first wafer, and a reception resonator is formed on the second wafer, the reception resonator comprising a first electrode, a piezoelectric layer, a second electrode and a passivation layer, which are sequentially stacked in a direction pointing from the second wafer to the first wafer, the reception cap cavity sealingly closing the reception resonator to form a reception filter, wherein a first hollow cavity is further formed in the emission region of the first wafer, and the emitter filter comprising the first hollow cavity, the emitter resonator and the emitter cap cavity, which are arranged in a direction pointing from the first wafer to the second wafer, and wherein a second hollow cavity is further formed in the receiving region of the second wafer, the reception filter comprising the second hollow cavity, the reception resonator and the reception cap cavity, which are arranged in a direction pointing from the second wafer to the first wafer, and wherein the reception filter is inverted relative to the emitter filter.

9. The electronic device of claim 8, wherein a sealing ring is further formed between the first and second wafers, the sealing ring surrounding both the emitter and reception filters.

10. The electronic device of claim 8, wherein the emitter resonator is formed above the first hollow cavity, and the first hollow cavity and the reception cap cavity in the first wafer are simultaneously formed in a same process using a same photomask; and/or wherein the reception resonator is formed above the second hollow cavity, and the second hollow cavity and the emitter cap cavity in the second wafer are simultaneously formed in a same process using a same photomask.

* * * * *